(12) United States Patent
Zhu et al.

(10) Patent No.: US 8,441,045 B2
(45) Date of Patent: May 14, 2013

(54) SEMICONDUCTOR DEVICE AND METHOD FOR MANUFACTURING THE SAME

(75) Inventors: Huilong Zhu, Poughkeepsie, NY (US); Qingqing Liang, Lagrangeville, NY (US); Haizhou Yin, Poughkeepsie, NY (US); Zhijiong Luo, Poughkeepsie, NY (US)

(73) Assignee: The Institute of Microelectronics, Chinese Academy of Sciences, Beijing (CN)

( * ) Notice: Subject to any disclaimer, the term of this patent is extended or adjusted under 35 U.S.C. 154(b) by 48 days.

(21) Appl. No.: 13/378,206

(22) PCT Filed: Feb. 27, 2011

(86) PCT No.: PCT/CN2011/071351
§ 371 (c)(1),
(2), (4) Date: Dec. 14, 2011

(87) PCT Pub. No.: WO2012/013036
PCT Pub. Date: Feb. 2, 2012

(65) Prior Publication Data
US 2012/0146103 A1   Jun. 14, 2012

(30) Foreign Application Priority Data
Jul. 27, 2010 (CN) .......................... 2010 1 0239273

(51) Int. Cl.
*H01L 27/085* (2006.01)
*H01L 29/84* (2006.01)
*H01L 29/80* (2006.01)
*H01L 31/112* (2006.01)
*H01L 29/04* (2006.01)

(52) U.S. Cl.
USPC ............ 257/255; 257/254; 257/627; 257/628

(58) Field of Classification Search ................. 257/254, 257/255, 627, 628
See application file for complete search history.

(56) References Cited

U.S. PATENT DOCUMENTS

| | | | |
|---|---|---|---|
| 5,867,192 A * | 2/1999 | Mantell et al. | 347/65 |
| 7,494,858 B2 * | 2/2009 | Bohr et al. | 438/198 |
| 7,696,568 B2 * | 4/2010 | Hwang et al. | 257/330 |

(Continued)

FOREIGN PATENT DOCUMENTS
CN   1 716 554   1/2006

*Primary Examiner* — Fernando L Toledo
*Assistant Examiner* — Karen Kusumakar
(74) *Attorney, Agent, or Firm* — Morgan, Lewis & Bockius LLP

(57) ABSTRACT

The present application discloses a semiconductor device and a method of manufacturing the same. Wherein, the semiconductor device comprises: a semiconductor substrate; a stressor embedded in the semiconductor substrate; a channel region disposed on the stressor; a gate stack disposed on the channel region; a source/drain region disposed on two sides of the channel region and embedded in the semiconductor substrate; wherein, surfaces of the stressor comprise a top wall, a bottom wall, and side walls, the side walls comprising a first side wall and a second side wall, the first side wall connecting the top wall and the second side wall, the second side wall connecting the first side wall and the bottom wall, the angle between the first side wall and the second side wall being less than 180°, and the first sidewall and the second side wall being roughly symmetrical with respect to a plane parallel to the semiconductor substrate. Embodiments of the present invention are applicable to the stress engineering technology in the semiconductor device manufacturing.

21 Claims, 5 Drawing Sheets

U.S. PATENT DOCUMENTS

| | | |
|---|---|---|
| 7,951,657 B2 * | 5/2011 | Cheng et al. .................. 438/151 |
| 7,968,421 B2 * | 6/2011 | Shin .............................. 438/424 |
| 2005/0285192 A1 | 12/2005 | Zhu |
| 2007/0020861 A1 * | 1/2007 | Chong et al. .................. 438/296 |
| 2007/0152277 A1 | 7/2007 | Shima |
| 2009/0101942 A1 * | 4/2009 | Dyer ............................. 257/288 |
| 2009/0250771 A1 | 10/2009 | Miyamura |
| 2011/0079820 A1 * | 4/2011 | Lai et al. ....................... 257/190 |

* cited by examiner

US 8,441,045 B2

SEMICONDUCTOR DEVICE AND METHOD FOR MANUFACTURING THE SAME

CROSS REFERENCE TO RELATED APPLICATION

This application is a national stage application, filed under 35 U.S.C. §371, of International Application No. PCT/CN2011/071351, filed on Feb. 27, 2011, entitled "SEMICONDUCTOR DEVICE AND METHOD FOR MANUFACTURING THE SAME", which claimed priority to Chinese Application No. 201010239273.3, filed on Jul. 27, 2010, all of which are hereby incorporated by reference in their entirety.

TECHNICAL FIELD

The present invention generally relates to semiconductor devices, and more specifically, to a strained semiconductor device structure and a method of manufacturing the same.

DESCRIPTION OF THE RELATED ART

With the development of the semiconductor technology, the integration level of integrated circuits has become higher and higher, while the feature size of semiconductor devices has been continually scaling down. However, continually scaling down of the feature size greatly deteriorates the performance of the devices.

Carrier mobility that may affect the current or electric charge flowing in a channel of a semiconductor device is a significant factor to maintain a proper performance in a field effect transistor. After the 90 nm-node CMOS (Complementary Metal Oxide Semiconductor Transistor) technology, stress technique starts its application to enhance the carrier mobility and further improve the drive current of the device. For example, MOSFET (Metal-Oxide-Semiconductor Field-Effect Transistor) may improve the carrier mobility by applying a strain to the channel between the source and drain, thereby enhancing the performance of integrated circuits. Specifically, for an nMOSFET, carriers in the channel are electrons, and tensile stress at two ends of the channel may increase the mobility of the electrons; for a pMOSFET, carriers in the channel are holes, tensile stress at two ends of the channel may increase the mobility of the holes.

With further increase of the integration level of integrated circuits, the requirement on stress application in manufacturing a semiconductor device has become much stricter in this industry. In view of the above, it is desirable to provide a novel semiconductor device and a method of manufacturing the same, so as to further enhance the stress in the channel region.

SUMMARY OF THE INVENTION

An objective of the present invention is to provide a semiconductor device and a method of manufacturing the same, which may further enhance the stress in the MOSFET channel region.

According to one aspect of the present invention, there is provided a semiconductor device, the semiconductor device comprising: a semiconductor substrate; a stressor embedded in the semiconductor substrate; a channel region on the stressor; a gate stack disposed on the channel region; and a source/drain region, which are on opposite sides of the channel region and embedded in the semiconductor substrate; wherein surfaces of the stressor comprise a top wall, a bottom wall, and sidewalls, the sidewalls comprising a first sidewall and a second sidewall, the first sidewall connecting the top wall and the second sidewall, the second sidewall connecting the first sidewall and the bottom wall, the angle between the first sidewall and the second sidewall being less than 180°, and the first sidewall and the second sidewall being roughly symmetrical with respect to a plane parallel to the semiconductor substrate.

In a preferred embodiment, the top wall and bottom wall are parallel to a surface of the semiconductor substrate. The shape of the stressor may be called a diamond shape.

In a preferred embodiment, the gate stack comprises: a gate dielectric layer and a gate conductive layer; the gate dielectric layer is preferably a high-k gate dielectric layer; and two sides of the gate conductive layer may further comprise gate sidewall spacers.

In a preferred embodiment, for an nMOSFET, the stressor has compressive stress; and for a pMOSFET, the stressor has tensile stress.

Preferably, in a region within the stressor and close to the first sidewall further comprises a source/drain extension region; or inside the channel region or beneath the channel region further comprises a halo implantation region.

In embodiments of the present invention, if there is an isolation structure surrounding the semiconductor device, a top surface of the source/drain region is lower than a top surface of the isolation structure.

Preferably, the crystal face of the top surface of the semiconductor substrate surface is {100} crystal face of Si; and the crystal face of the first sidewall and the second sidewall are both {111} crystal face of Si; or the crystal face of the top surface of the semiconductor substrate surface is {100} crystal face; or the angle between the first sidewall and the second sidewall is) (109°29'±2°.

According to another aspect of the present invention, there is provided a method of manufacturing a semiconductor device, the method comprising: providing a semiconductor substrate; forming a stressor embedded in the semiconductor substrate; forming a channel region disposed on the stressor; forming a gate stack disposed on the channel region; forming source/drain regions on opposite sides of the gate stack and embedded in the semiconductor substrate; wherein, surfaces of the stressor comprise a top wall, a bottom wall, and sidewalls, the sidewalls comprising a first sidewall and a second sidewall, the first sidewall connecting the top wall and the second sidewall, the second sidewall connecting the first sidewall and the bottom wall, the angle between the first sidewall and the second sidewall being less than 180°, and the first sidewall and the second sidewall being roughly symmetrical with respect to a plane parallel to the semiconductor substrate. In a preferred embodiment, the top wall and bottom wall are parallel to a surface of the semiconductor substrate.

Preferably, forming a stressor comprises: forming a dielectric layer on the semiconductor substrate; etching a dielectric layer and a semiconductor substrate, until forming a trench that is embedded in the semiconductor substrate and has the same shape as the stressor; and forming the stressor epitaxially in the trench.

In a preferred embodiment, before etching the dielectric layer and the semiconductor substrate, the method may further comprise: forming an isolation structure embedded into the dielectric layer and semiconductor substrate.

In a preferred embodiment, the step of forming the trench on the semiconductor substrate may specifically comprise: forming a rectangular trench on the semiconductor substrate; and forming the trench that has the same shape as the stressor by wet etching of the rectangular trench; wherein the wet etching is performed along the {111} crystal face of Si. The solution used in wet etching may be KOH or TMAH.

In a preferred embodiment, the method of forming the channel region may comprise: forming a Si layer on the stressor by epitaxial growth.

In a preferred embodiment, the method of forming the gate stack may comprise: forming a gate dielectric layer on the channel region; forming a sacrificial sidewall spacer on inner walls of the etched dielectric layer; forming a gate conductive layer within a region surrounded by the sacrificial sidewall spacer; and removing the dielectric layer and the sacrificial sidewall spacer.

In a preferred embodiment, after removing the dielectric layer, the method may further comprise: forming a gate sidewall spacer on two sides of the gate conductive layer.

Alternatively, after removing the dielectric layer, the method may further comprise: performing inclined ion implantation to form a source/drain extension region in a region adjacent to the first sidewall; and/or further comprising: performing inclined ion implantation to form a halo implantation region within the channel region or beneath the channel region.

By using the semiconductor device and the method of manufacturing the same as provided by embodiments of the present invention, through forming a stressor that has a small top and bottom while a biggest middle or has a diamond shape beneath the channel region, the upper part of the stressor may generate an upward and outward pressure or a downward and inward tension in the channel region disposed thereon, thereby resulting in that the acting force at two sides of the channel region is a tensile stress or compressive stress, improving the carrier mobility in the channel region and enhancing the device performance.

BRIEF DESCRIPTION OF THE DRAWINGS

The above and other objectives, features and advantages of the present invention will become much clearer through the following description on preferred embodiments of the present invention with reference to the accompanying drawings in which.

DETAILED DESCRIPTION OF THE PREFERRED EMBODIMENTS

Hereinafter, the present invention will be described through specific embodiments as illustrated in the accompanying drawings. However, it should be understood that the description is only exemplary, not intended to limit the scope of the present invention. Additionally, in the following description, depiction on well-known structures and technologies are omitted to avoid unnecessarily confusing the concepts of the present invention.

The figures illustrate the layered structural diagrams according to embodiments of the present invention. These figures are not drawn proportionally, where for the sake of clarity, some details may be magnified, and some details may be omitted. Various regions, shapes of layers, and the relative sizes and positional relationships therebetween are only exemplary. In actuality, some deviations may exist due to manufacturing tolerance or technical restraints, and those skilled in the art may otherwise design regions/layers having different shapes, sizes and relative positions as required.

FIGS. 1-14 illustrate in detail sectional views of various steps in the flow of manufacturing a semiconductor device according to embodiments of the present invention. Hereinafter, various steps and the semiconductor device derived therefrom according to the embodiments of the present invention will be described in detail with reference to these figures.

Figure 1:
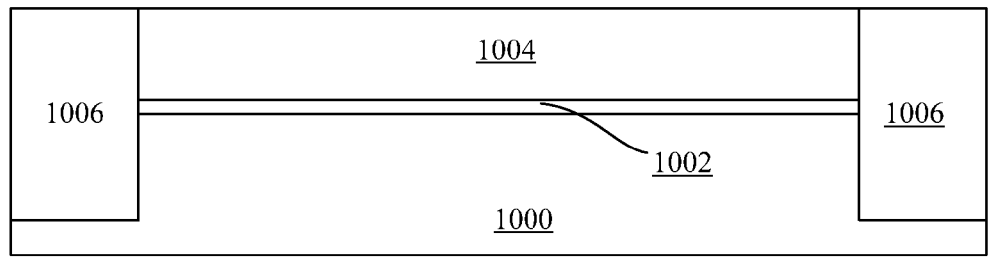
FIGS. 1-14 illustrate sectional views of various steps in the flow of manufacturing a semiconductor device according to embodiments of the present invention.

First, as illustrated in FIG. 1, a semiconductor substrate 1000 is provided. The substrate 1000 may comprise any appropriate semiconductor substrate material, specifically including, but not limited to, Si, Ge, SiGe, SOI (silicon on insulator), silicon carbide, GaAs, or any III/V family compound semiconductor, etc. According to design specifications known in the prior art (for example p-type substrate or n-type substrate), the substrate 1000 may comprise various kinds of doped configurations. Besides, the substrate 1000 may alternatively comprise an epitaxial layer that may be stress changed to enhance the performance. With different substrates employed, subsequent processes also vary slightly. In the present invention, the most conventional substrate is employed to illustrate how to implement the present invention.

Thus, in an embodiment of the present invention, Si is selected as the semiconductor substrate, and the semiconductor substrate surface is a {100} crystal face of Si.

Alternatively, a pad oxide layer 1002 whose thickness may be 5-8 Å is first formed on the semiconductor substrate 1000. Next, a dielectric layer 1004 is formed on the pad oxide layer 1002, which is generally $Si_3N_4$ or other nitride, with a thickness level with the height of the to-be-formed gate, for example 50-200 nm.

Then, an isolation structure 1006 is formed on the semiconductor substrate 1000, for example, a common STI (shallow trench isolation), to isolate this device structure from other device structures.

Figure 2:
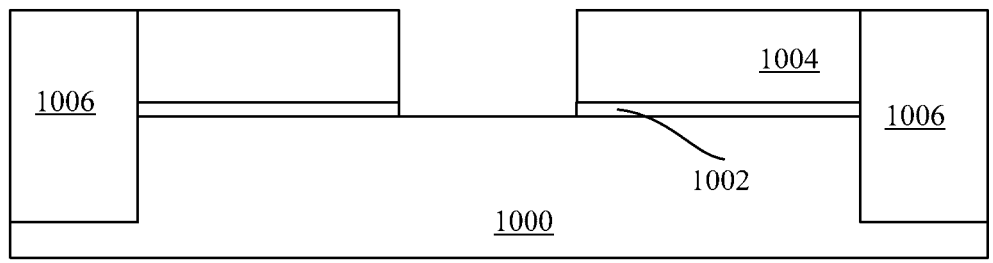

Next, as illustrated in FIG. 2, an opening is formed in the pad oxide layer 1002 and dielectric layer 1004 over the semiconductor substrate 1000. For example, the opening may be formed by protecting other parts with photoresist and performing reactive ion etching to the unprotected part.

Figure 3:
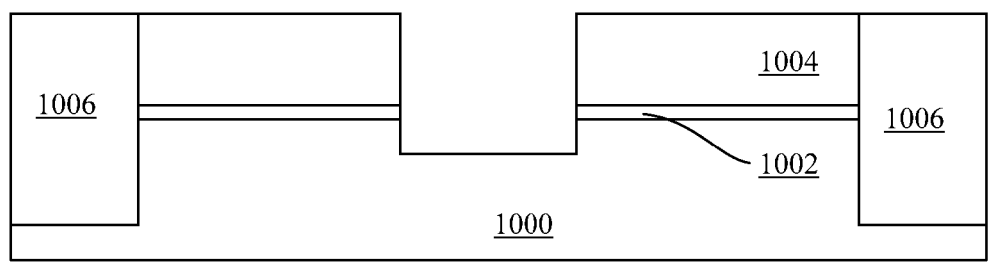

As illustrated in FIG. 3, the opening is further etched downward until into the semiconductor substrate 1000, to be further embedded into the semiconductor substrate 1000 to form a rectangular trench. For example, anisotropic dry or wet etching may be employed.

Figure 4:
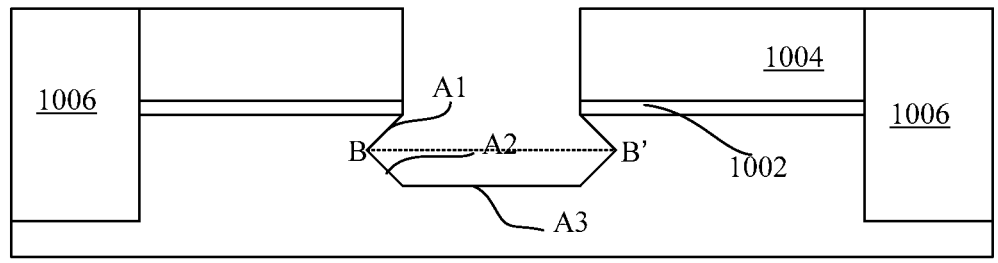

Next, as illustrated in FIG. 4, a diamond-shape trench that is large in middle and small in the upper and lower portions is formed based on the semiconductor substrate 1000. This trench has a bottom wall A3 and sidewalls, the sidewalls comprising a first sidewall A1 and a second sidewall A2, the second sidewall A2 being connected to the first sidewall A1 and the bottom wall A3, respectively, the angle between the first sidewall A1 and the second sidewall A2 being less than 180°, and the first sidewall A1 and the second sidewall A2 being symmetrical with respect to a surface parallel to the semiconductor substrate 1000, for example, the surface where BB' is located and parallel to {100} crystal face in FIG. 4. Specifically, KOH, TMAH or other etching solution is employed to wet etch the semiconductor substrate in the rectangular trench, and the etching will be performed along the {111} crystal faces of Si, which results in that in this diamond-shape trench, the crystal faces where the first sidewall A1 and the second sidewall A2 lie are the {111} crystal faces of Si.

Figure 5:
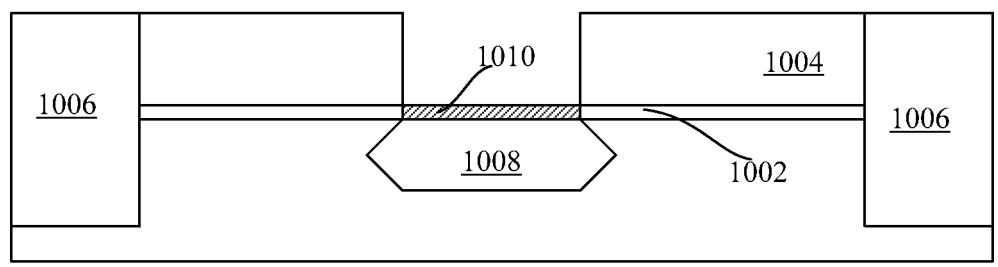

As illustrated in FIG. 5, a stressor 1008 is formed epitaxially in the diamond-shaped trench, and a Si layer 1010 is formed epitaxially on the stressor 1008. For the nMOSFET, the stressor 1008 as epitaxially formed needs compressive stress. For example, it may be SiGe, wherein the content of Ge is 10-60%. For the pMOSFET, the stressor as epitaxially formed needs tensile stress. For example, it may be Si:C, wherein the content of C is 0.2-2%. The epitaxially formed Si layer 100 will act as a channel region of the device. Accordingly, for nMOSFET, the stressor 1008 may generate an outward pressure to the first sidewall A1 at two sides; while for pMOSFET, the stressor 1008 may generate an inward and downward tension to the first sidewall A1 at two sides.

Figure 6:
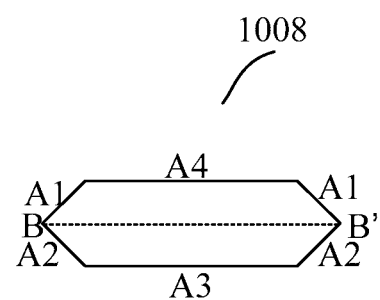

FIG. 6 illustrates a diagram of sidewalls of the formed stressor 1008. After forming the stressor 1008, it may be seen that the first sidewall A1, the second sidewall A2 and the bottom wall A3 of the trench are also the sidewalls and bottom wall of the stressor, and meanwhile, the stressor 1008 also has a top wall A4. The top wall A4 and the bottom wall A3 are parallel to the surface of the semiconductor substrate; or, the top wall A4 and the bottom wall A3 are located at the {100} crystal face of Si, while the first sidewall A1 and the second sidewall A2 are located at the {111} crystal face of Si.

The epitaxial Si layer 1010 on the stressor 1008 will act as the channel region of the finally formed semiconductor device.

Figure 7:
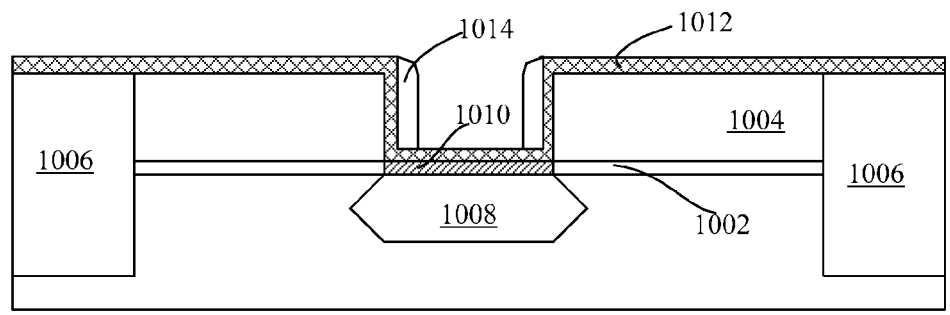

Next, a gate dielectric layer is formed in the opening formed by the Si epitaxial layer 1010 and the dielectric layers 1006 at two sides. According to the current conventional process, high-k dielectric is generally employed, and metal is employed as a gate conductive layer. As illustrated in FIG. 7, a high-k dielectric layer 1012 may be formed on the surface of the whole device, for example, it may be any one of or a combination of several of $HfO_2$, HfSiO, HfSiON, HfTaO, HfTiO, HfZrO, $Al_2O_3$, $La_2O_3$, $ZrO_2$, and LaAlO. Then, in the opening, sacrificial sidewall spacers 1014 are formed adjacent to the sidewalls of the gate dielectric layer 1012. The sacrificial sidewall spacers 1014 may define a gate length. For example, the required thickness for the sacrificial sidewall spacers may be determined based on the defined gate length as required, so as to effectively control the length of the gate and further control the length of the channel region. The method of forming sacrificial sidewall spacers 1014 may comprise: forming a dielectric layer on the high-k gate dielectric layer 1012, for example, $Si_3N_4$, and its thickness may be 50-150 nm; then performing reactive ion etching, thereby forming the sacrificial sidewall spacers on the sidewalls of the high-k gate dielectric layer 1012.

Figure 8:
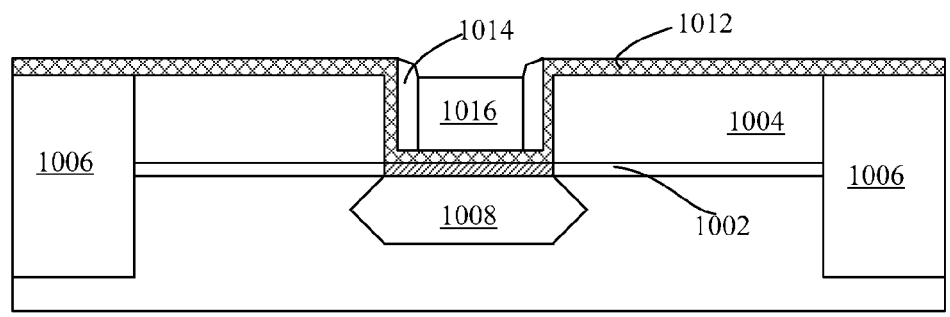

As illustrated in FIG. 8, a gate conductive layer 1016 is formed in the space enclosed by the inner walls of the sacrificial sidewall spacers 1014. The gate conductive layer may be a metal layer or metal/polycrystalline stack, wherein the metal layer may comprise a work function metal layer that is capable of adjusting the work function of the device. After forming the gate conductive layer 1016, etchback is preferably performed on the gate conductive layer 1016, thereby forming the shape as shown in FIG. 8.

Figure 9:
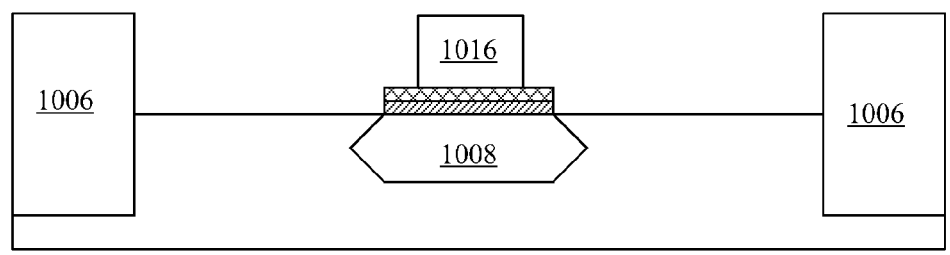

Next, the sacrificial sidewall spacers 1014 are removed, and then the dielectric layer 1004 and the pad oxide 1002 are also removed, thereby forming a structure of FIG. 9.

Figure 10:
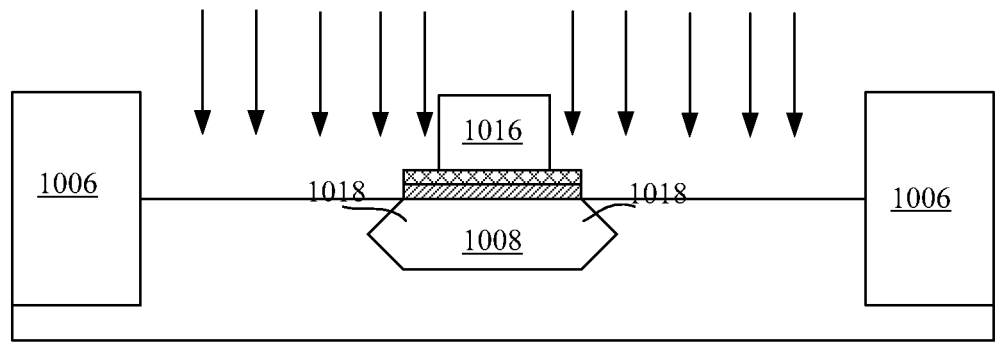

As illustrated in FIG. 10, a lightly doped drain (LDD) step is performed, thereby forming a source/drain extension region 1018 in a region in the stressor 1008 close to the first sidewall A1. For example, for the nMOSFET, As or P may be lightly doped; and for the pMOSFET, B or In may be lightly doped. Alternatively, an inclined ion implantation may be performed; for the pMOSFET, As or P may be implanted; for the nMOSFET, B or In may be implanted; therefore, a halo implantation region (not shown) is formed in or beneath the Si layer 1010, which may better inhibit the short channel effect.

Figure 11:
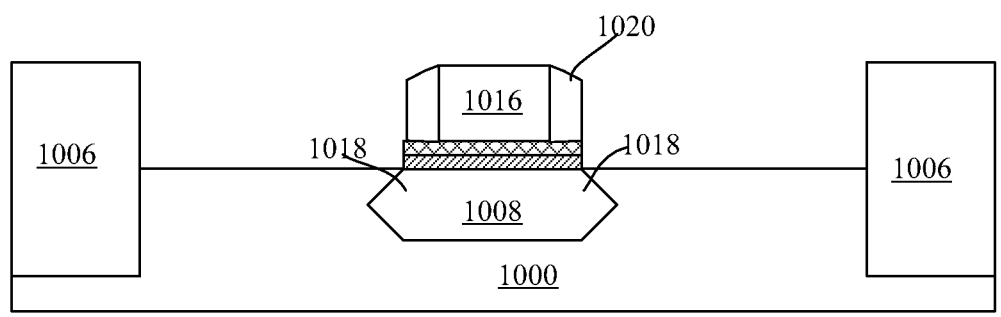

Further, as shown in FIG. 11, a gate sidewall spacer 1020 is formed at two sides of the gate conductor 1016; therefore, the gate conductor 1016 may be effectively isolated from the source/drain region.

Figure 12:
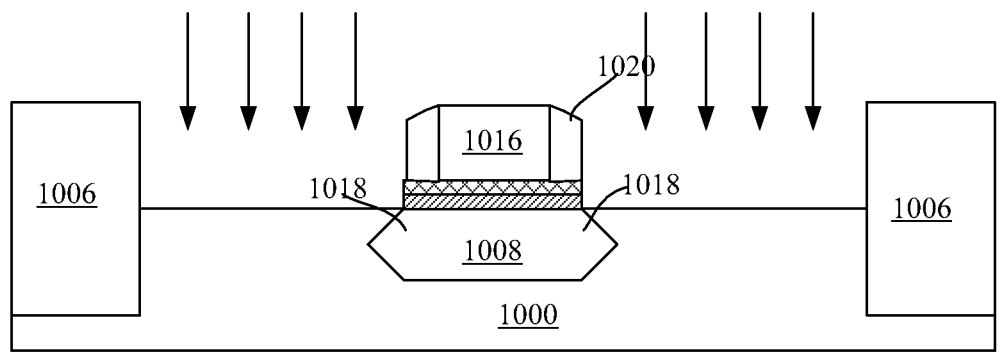
Figure 13:
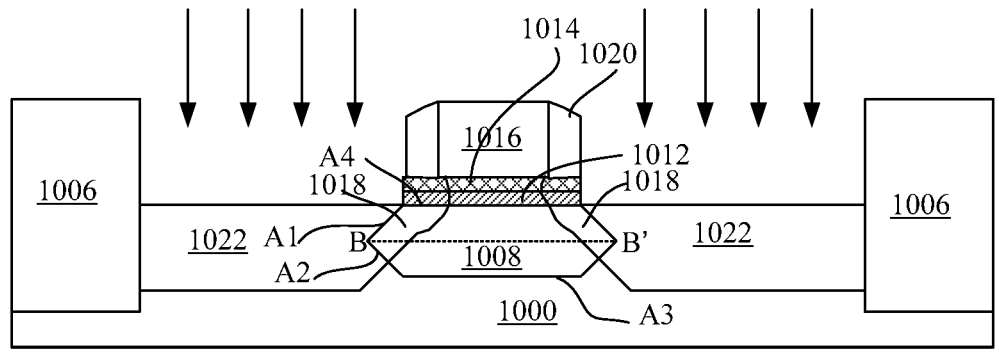

Next, as illustrated in FIG. 12, heavy doped ion implantation is performed, thereby forming the source/drain region 1022 as illustrated in FIG. 13. Likewise, for nMOSFET, As or P may be doped; for pMOSFET, B or In may be doped. Afterwards, annealing is performed within the temperature range of 800-1200° C. Therefore, the Si layer 1010 becomes the channel region between the source region and the drain region.

Figure 14:
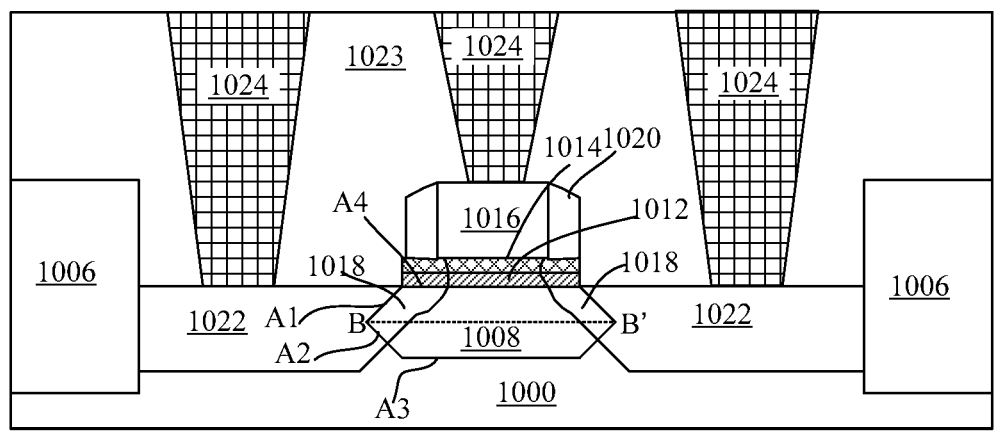

Further, as illustrated in FIG. 14, an interlayer dielectric 1023 may be further formed above the semiconductor device, and contacts 1024 are formed in the interlayer dielectric 1023.

Therefore, a semiconductor device as derived according to one embodiment of the present invention is illustrated in FIG. 13. The semiconductor device comprises: a semiconductor substrate 1000; a stressor 1008 embedded in the semiconductor substrate; a channel region 1010 disposed on the stressor 1008; a gate stack disposed on the channel region 1010; a source/drain region 1022 disposed on two sides of the channel region 1010 and embedded in the semiconductor substrate 1000; wherein, the stressor 1008 has a top wall A4, a bottom wall A3, and sidewalls, the sidewalls comprising a first sidewall A1 and a second sidewall A2, the first sidewall A1 being connected to the top wall A4 and the second sidewall A2, the second sidewall A2 being connected to the first sidewall A1 and the bottom wall A3, the angle between the first sidewall A1 and the second sidewall A2 being less than 180°, and the first sidewall A1 and the second sidewall A2 being symmetrical with respect to a plane parallel to the semiconductor substrate 1000, for example, the plane where BB' is located and in parallel with the semiconductor substrate surface in FIG. 13. The bottom wall A3 and the top wall A4 are parallel to the surface of the semiconductor substrate 1000. Besides, the shape of the formed stressor is a diamond shape.

The gate stack comprises: a gate dielectric layer 1012 and a gate conductive layer 1016; the gate dielectric 1012 layer is a high-k gate dielectric layer.

Preferably, gate sidewall spacers 1020 are further comprised at two sides of the gate conductor 1016.

Wherein, for the nMOSFET, the stressor 1008 has a tensile stress, which, for example, may be formed by comprising SiGe, where the content of Ge may be 10-60%; for the pMOSFET, the stressor 1008 has a compressive stress, which, for example, may be formed by Si:C, where the content of C may be 0.2-2%.

Preferably, in one embodiment of the present invention, a source/drain extension region 1018 is comprised in a region in the stressor 1008 close to the first sidewall A1. Preferably, a halo implantation region (not shown) is comprised in or under the channel region 1010.

In the prior art, due to the erosion and etching of various process flows to the STI, the top height of the STI structure may be lower than the surface height of the source/drain region, and then the stress on the source/drain region may be released off over the top of the STI. However, in the embodiments of the present invention, the surface height of the source/drain region is lower than the height of the STI; therefore, the stress will not be released off over the STI structure, which greatly enhances the stress at two sides of the channel region.

For the nMOSFET, the stress region has a compressive stress. Because compressive stress exists over the stressor, an upward and outward pressing force may be provided at two sides of the channel region 1010; the effect of this force finally generates a tensile stress at the two sides of the channel region 1010; therefore, the electron mobility in the channel region of the nMOSFET may be improved; for the pMOSFET, the stress region has a tensile stress. Because tensile stress exists over the stressor, a downward and inward pulling force may be proved at two sides of the channel region 1010. The effect of this force is to finally generate a tensile stress at two sides of the channel region 1010; therefore, the mobility of the holes in the channel region of the pMOSFET may be improved.

According to one embodiment of the present invention, wherein the crystal face where the semiconductor substrate 100 is located is {100} crystal face of Si; the crystal faces where the first sidewall A1 and the second sidewall A2 are located are the {111} crystal face of Si. The appearance of the stressor 1008 is the same as the diamond-shape trench. The trench may be formed by wet etching. In the wet etching, the etching may be performed along the {111} crystal face of Si, thereby forming a diamond-shape trench. As to the positional relationships between the four faces A1, A2, A3, and A4, please refer to FIG. 6. Wherein, A1 and A1 are disposed at {111} crystal faces of Si, and A3 and A4 are disposed at {100} crystal faces of Si.

Because partial deviation might exist in wet etching, in the case that the surface of the semiconductor substrate is {100} crystal face, with respect to the stressor, the angle between the first sidewall A1 and the second sidewall A2 is 109° 29'±2°.

Further, as illustrated in FIG. 14, an interlayer dielectric 1023 may be further formed over the semiconductor device, and contacts 1024 are formed in the interlayer dielectric 1023.

In the above description, technical details like patterning and etching of each layer are not described in detail. However, those skilled in the art should understand that layers and regions and the like having a required shape may be formed through various means in the prior art. Additionally, to form a same structure, those skilled in the art may design a method that is not completely identical to the above described method.

The present invention has been illustrated above with reference to the embodiments of the present invention. However, these embodiments are only for illustrative purposes, not intended to limit the scope of the present invention. The scope of the present invention is defined by the appended claims and the equivalents. Those skilled in the art may make various replacements and modifications without departing from the scope of the present invention, and these replacements and modifications should fall within the scope of the present invention.

What is claimed is:

1. A semiconductor device, comprising:
   a semiconductor substrate;
   a stressor embedded in the semiconductor substrate;
   a channel region on the stressor;
   a gate stack on the channel region; and
   source/drain regions, which are on opposite sides of the channel region and embedded in the semiconductor substrate,
   wherein surfaces of the stressor comprises a top wall, a bottom wall, and sidewalls, the sidewalls comprising a first sidewall and a second sidewall, the first sidewall being connected to the second sidewall and the top wall, the second sidewall being connected to the first sidewall and the bottom wall, the angle between the first sidewall and the second sidewall being less than 180°, and the first sidewall and the second sidewall being roughly symmetrical with respect to a plane parallel to the semiconductor substrate.

2. The semiconductor device according to claim 1, wherein the gate stack comprises: a high-k gate dielectric layer and a gate conductive layer.

3. The semiconductor device according to claim 2, wherein there is a gate sidewall spacer on both sides of the gate conductive layer.

4. The semiconductor device according to claim 1, wherein for an nMOSFET, the stressor has a compressive stress; and for a pMOSFET, the stressor has a tensile stress.

5. The semiconductor device according to claim 1, wherein a region inside the stressor and close to the first sidewall further comprises a source/drain extension region.

6. The semiconductor device according to claim 1, wherein there is a halo implantation region in or beneath the channel region.

7. The semiconductor device according to claim 1, wherein, if there is an isolation structure surrounding the semiconductor device, a top surface of the source/drain region is lower than a top surface of the isolation structure.

8. The semiconductor device according to claim 1, wherein the top wall and the bottom wall are parallel to the semiconductor substrate surface.

9. The semiconductor device according to claim 1, wherein the crystal face of the top surface of the semiconductor substrate is {100} crystal face of Si, and the crystal face of the first sidewall and the second sidewall are both {111} crystal face of Si.

10. The semiconductor device according to claim 1, wherein the crystal face of the top surface of the semiconductor substrate surface is {100} crystal face of Si, and the angle between the first sidewall and the second sidewall is 109°29'±2°.

11. A method of manufacturing a semiconductor device, comprising:
    providing a semiconductor substrate;
    forming a stressor embedded into the semiconductor substrate;
    forming a channel region on the stressor;
    forming a gate stack on the channel region; and
    forming source/drain regions on opposite sides of the gate stack and embedded in the semiconductor substrate;
    wherein surfaces of the stressor comprises a top wall, a bottom wall, and sidewalls, the sidewalls comprising a first sidewall and a second sidewall, the first sidewall being connected to the second sidewall and the top wall, the second sidewall being connected to the first sidewall and the bottom wall, the angle between the first sidewall and the second sidewall being less than 180°, and the first sidewall and the second sidewall being roughly symmetrical with respect to a plane parallel to the semiconductor substrate.

12. The method according to claim 11, wherein forming the stressor comprises:
    forming a dielectric layer on the semiconductor substrate;
    etching the dielectric layer and the semiconductor substrate, until forming a trench that is embedded in the semiconductor substrate and has the same shape as the stressor; and
    forming the stressor in the trench by epitaxial growth.

13. The method according to claim 12, before etching the dielectric layer and the semiconductor substrate, the method further comprises:
    forming an isolation structure embedded into the dielectric layer and the semiconductor substrate.

14. The method according to claim 12, wherein forming the trench embedded in the semiconductor substrate comprises:

forming a rectangular trench in the semiconductor substrate; and forming the trench that has the same shape as the stressor by wet etching of the rectangular trench, wherein the wet etching is performed along {111} crystal face of Si.

15. The method according to claim 14, wherein a solution used in the wet etching is KOH or TMAH.

16. The method according to claim 11, wherein forming the channel region comprises: forming a Si layer on the stressor by epitaxial growth.

17. The method according to claim 11, wherein for an nMOSFET, the stressor has a compressive stress; and for a pMOSFET, the stressor has a tensile stress.

18. The method according to claim 12, wherein forming the gate stack comprises:

forming a gate dielectric layer on the channel region;

forming a sacrificial sidewall spacer on inner walls of the etched dielectric layer;

forming a gate conductive layer in a region surrounded by the sacrificial sidewall spacer; and removing the dielectric layer and the sacrificial sidewall spacer.

19. The method according to claim 18, wherein, after removing the dielectric layer, the method further comprises: forming a gate sidewall spacer on two sides of the gate conductive layer.

20. The method according to claim 18, wherein, after removing the dielectric layer, the method further comprises:

performing inclined ion implantation to form a source/drain extension region in a region in the stressor close to the first sidewall.

21. The method according to claim 18, wherein, after removing the dielectric layer, the method further comprises:

performing inclined ion implantation to form a halo implantation region in or beneath the channel region.

* * * * *